United States Patent [19]

Mourou

[11] 4,218,618
[45] Aug. 19, 1980

[54] APPARATUS FOR SWITCHING HIGH VOLTAGE PULSES WITH PICOSECOND ACCURACY

[75] Inventor: Gerard Mourou, Rochester, N.Y.

[73] Assignee: The University of Rochester, Rochester, N.Y.

[21] Appl. No.: 13,642

[22] Filed: Feb. 21, 1979

[51] Int. Cl.³ .............................................. H01J 40/14
[52] U.S. Cl. ................................................. 250/211 J
[58] Field of Search ......................... 250/211 R, 211 J; 357/29, 30; 350/96.3

[56] References Cited

U.S. PATENT DOCUMENTS

| | | | |
|---|---|---|---|
| 3,809,953 | 5/1974 | Nishizawa | 357/30 |
| 3,917,943 | 11/1975 | Auston | 250/211 J |

*Primary Examiner*—David C. Nelms
*Attorney, Agent, or Firm*—Martin LuKacher

[57] ABSTRACT

Switching of high voltage pulses (of the order of 10 kV) of durations from about 10us (microseconds) to 10 ms (milliseconds) with picosecond accuracy is accomplished by a laser activated semiconductor switch made up of a body (18) of high resistivity semiconductor material, such as nearly intrinsic silicon, integrated into a wide band (10GHz) geometry, which is part of a transmission line (28). The high bias voltage pulses are obtained by charging the line in synchronism with the generation of the laser pulse. The high voltage bias pulse width can be typically in the range of 10 us–10 ms, and the length of the body (18) is selected so as to prevent thermal breakdown of the semiconductor with such pulse widths. The energy of the laser pulse switches the high voltage to produce a multikilovolt output pulse suitable for driving devices, such as streak cameras or Pockels cells, by the same laser, which need to be synchronized with picosecond accuracy to the laser pulse. The length of the transmission line may be varied to adjust the width of the multikilovolt output pulse.

11 Claims, 3 Drawing Figures

APPARATUS FOR SWITCHING HIGH VOLTAGE PULSES WITH PICOSECOND ACCURACY

DESCRIPTION

The present invention relates to apparatus for switching high pulses and particularly to apparatus for generating high voltage (multikilovolt) pulses which can be synchronized with an optical pulse with picosecond accuracy.

The invention is especially suitable for use in generating adjustable width pulses of high voltage which are synchronous with picosecond accuracy with laser pulses. These pulses may be used for the activation of Pockel's cells, streak cameras, or other devices which require picosecond synchronization with the laser pulse.

It is a principal feature of the present invention to provide improved laser activated semiconductor switches capable of switching high voltage (multikilovolt) pulses of durations from 10 µs to 10 ms (which are long enough to be easily synchronizable with the laser which activates the switch). Laser activated switches in a coaxial geometry which have heretofore been suggested were capable only of switching very short pulses (in the nanosecond (ns) regime) (see Antonetti, Malley, Mourou, and Orszag, *Optics Communications*, Vol. 23, No. 3, December 1977, Pages 435 to 439, the references cited therein and also in U.S. Pat. No. 3,917,943, issued Nov. 4, 1975, which shows such a switch in a microstrip geometry).

A thermal instability encountered in the operation of such laser activated switches has prevented them from being capable of switching longer pulses. There has been a great need for multikilovolt picosecond pulses of high voltage which are synchronous with laser pulses in order to control Pockel's cells and streak cameras and for other applications. In order to provide such synchronization the pulses to be switched must be easily synchronizable with the laser. Such synchronization in the nanosecond regime is difficult to obtain. Accordingly, laser activated semiconductor switches of the type heretofore available were not capable of meeting the need for pulses of high voltage which are synchronous with laser pulses with picosecond accuracy.

The mechanism by which thermal instability in semiconductors limits light activated semiconductor switches (in holding off long duration pulses) has been discovered and applied in accordance with the invention to provide laser activated switching apparatus capable of switching with picosecond accuracy high voltage pulses of the order of 10 kV and durations from 10 µs to 10 ms. The invention permits the selection of laser pulse energy, bias pulse voltage and duration to satisfy operational requirements of the devices which make use of the pulses.

Accordingly, it is an object of the present invention to provide improved apparatus for high voltage switching.

It is another object of the invention to provide apparatus for generating pulses of high voltage which are synchronous with laser pulses with picosecond accuracy.

It is a further object of the present invention to provide improved laser activated semiconductor switching apparatus.

Briefly described, apparatus for switching high voltage pulses having magnitudes of the order of 10 kV (i.e., multikilovolt pulses) and durations of the order of microseconds (i.e., from 10 µs to 10 ms) in a period of time of the order of picoseconds (e.g., 30 to 40 picoseconds) uses a body of semiconductor material. The material's resistivity is subject to thermal instability which depends upon the length of the body (sometimes called gap length), magnitude of applied voltage, and initial resistivity. The voltage applied to the body is a pulse which may be referred to as the "bias pulse". When illuminated by sufficient optical energy of a certain wavelength, as from a laser, the resistivity of the body of semiconductor material decreases by about 5 orders of magnitude (a decade being an order of magnitude). The body of semiconductor material may be contained in a wide band, say 10 GHz, geometry, which is part of a transmission line charged by the bias pulse. The bias pulse is generated synchronously with the laser pulse. In order to determine the maximum bias pulse width, length, L, of the body in a direction along the transmission line, is selected such that during the period of the bias pulse, for a voltage magnitude $V_o$ of the bias pulse applied to the body by the line, the change, $T - T_o$, of temperature T, of the body from an initial temperature $T_o$, such as room temperature, the resistivity, p, of the body drops, no more than 50% from the resistivity, $p_o$, at the initial temperature where $$\frac{dT}{dt} = \frac{V_o^2}{dcL^2 p}, \text{ and} \quad (1)$$

$$p = p_o \left(\frac{T}{T_o}\right)^{3/2} \exp\frac{-E_g}{2k}\left(\frac{1}{T} - \frac{1}{T_o}\right) \quad (2)$$

where T is the instantaneous temperature of the body in degrees Kelvin at the time t, $T_o$ is the initial temperature in degrees Kelvin, p is the resistivity in ohms per centimeter, $p_o$ is the resistivity of the body in ohms per centimeter at temperature $T_o$, c is the specific heat of the semiconductor material of the body, L is the length of the body in centimeters, k is the Boltzmann constant, $E_g$ is the band gap energy of the semiconductor material in Joules, $V_o$ is the bias pulse voltage, and d is the density of the semiconductor material in grams per cubic cm. In order to produce the reduction in resistivity of about 5 orders of magnitude (i.e., the transmission through the line must increase from cut-off (i.e., no transmission) to about 90% transmission and thereby discharge the line to produce an output pulse with picosecond accuracy in its synchronization with the laser pulse) the absorbed layer energy $E_a$, in Joules, should be $$E_a = \frac{5h\nu V_o L}{Z_o e V_s} \quad (3)$$

where h is Planck's constant, $\nu$ is the optical frequency of the laser pulse in sec$^{-1}$, e is the charge of the electron, $V_s$ is the carrier saturation velocity of the semiconductor material of the body (which is at high electrical fields $10^7$ cm/sec), and $Z_o$ is the impedance of the line. It is preferable to use nearly intrinsic silicon for the body and low repetition rates (10–100 Hz) for the bias and laser pulses. Thermal dissipation effects then are negligible.

The foregoing objects, advantages and features of the invention as well as the presently preferred embodiment thereof will be more apparent from a reading of the following description in connection with the accompanying drawings in which.

Figure 1:
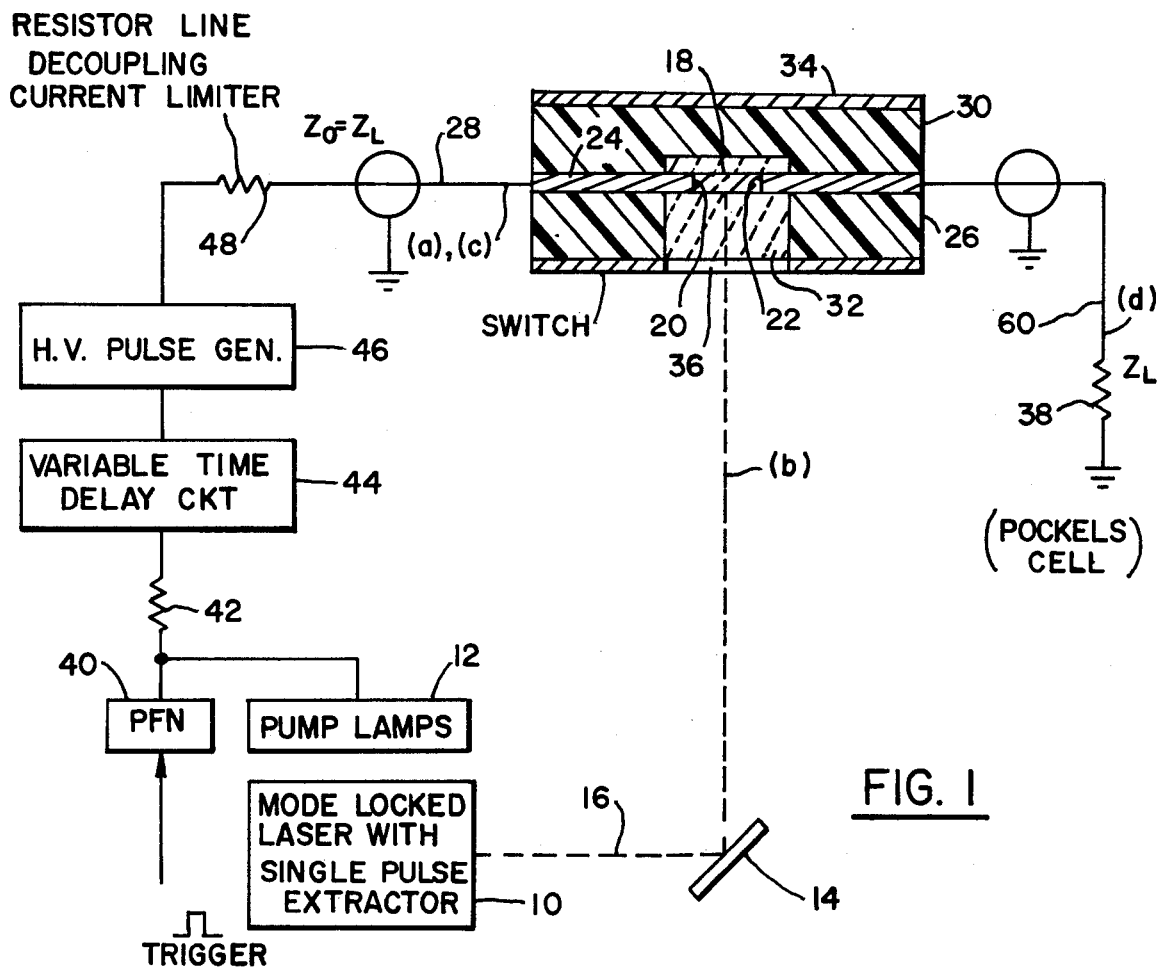
FIG. 1 is a schematic block diagram, illustrating apparatus for switching high voltage pulses in accordance with the invention.

Referring now to FIG. 1, a laser 10, which may be a mode locked laser equipped with a single pulse extractor, when pumped by the firing of pump lamps 12, produces an optical pulse along a path defined by a mirror 14 and shown by the dashed lines 16. This pulse is incident on a cylindrical body 18 of semiconductor material which consists, in this embodiment, of nearly intrinsic silicon. The silicon may be slightly n or p type doped (i.e., $10^{12}$ to $10^{13}$ charge carriers per cubic cm).

Since silicon has a resistivity which decreases drastically with optical energy of a wavelength of 1.06 $\mu$m or smaller, the mode locked laser may be a Nd+++:YAG laser which produces pulses of 1.06 $\mu$m wavelength. In this example these optical pulses which activate the switching may be 40 ps in duration and have an optical energy of 30 $\mu$J (micro Joules).

For an absorbed optical energy Ea and large bias fields (greater than $10^4$ volts per centimeter), as are generally applied to the body by the bias pulses which are switched, the resistance longitudinally between the ends 20 and 22 of electrodes 24 and 26 which are opposed to each other may be expressed by $$R \times \frac{h v V_o L}{2 E_a e V_s} \qquad (4)$$

where R is the resistance expressed in ohms, h is Planck's constant, $v$ is the optical frequency in $cm^{-1}$, $V_o$ is the voltage magnitude applied across the body 18, $E_a$ is the optical energy absorbed by the body from the laser pulse, e is the charge of the electron, and $V_s$ is the carrier saturation velocity in centimeters per second. It has been found that skin effect may be neglected. In the absence of the laser pulse the resistance is very high, the resistivity $p_o$ being approximately $2 \times 10^4$ ohm-centimeters. When the bias pulse is switched, i.e., in the presence of the laser pulse, the resistance of the body 18 drops several (e.g. 5 to 6) orders of magnitude.

The body 18 and the electrodes 24 and 26 are part of the central conductor of a coaxial cable which forms a transmission line 28. The body may be cylindrical or rectangular. To mount the body 18 in this line, metal (e.g. Cu) electrodes 24 and 26 are provided by rods held in an insulating (e.g., tetrafluoroethylene) (Teflon) cylinder 30 within a cylindrical metal tube 34. An opening 32 is cut in the tube and through the Teflon cylinder 30. The electrodes 24 and 26 are exposed and the body 18 is mounted in the gap between their opposed ends 20 and 22. The body is plotted with clear epoxy to prevent corona discharge by filling the opening 32 up to a window 36 in the tube 34 which enables the laser pulse to be incident upon the body 18. The characteristic impedance $Z_o$ of the line 28 is made equal to the impedance $Z_L$ of a load 38. This load may be a Pockel's cell, Kerr cell, or streak camera or other device which demands pulses of high voltage which are synchronous with lazer pulses with picosecond accuracy. The optical energy required to reduce the resistance of the body 18 to at least 1/10th the line impedance $Z_o$ is a function of the length, L, of the body 18 (the length of the gap between the opposed ends 20 and 22 of the electrodes 24 and 26), the voltage applied across the body, and the characteristics of the semiconductor material. The required amount of optical energy is given in Equation (3) above. For example, when the length L of the body is 5 mm (millimeters) and the applied voltage is 8 kV, the laser pulse energy is 30 $\mu$J. The line then is discharged to produce an output pulse of 4 kV magnitude and a duration of approximately 2 $l_{28}/V_p$, $l_{28}$ is the line 28 length and $V_p$ is the electrical propagation speed in the line 28.

The duration of the bias pulse applied to the body 18 is a function of the length of body and the magnitude of the voltage. The invention permits the use of pulse generators which enable pulses of up to 10 ms to be generated. Typically these bias pulses are from 10 us to 10 ms in width. In the example mentioned above where the length L of the body 18 is 5 mm, the laser pulse has an energy of 30 $\mu$J at a wavelength of 1.06 $\mu$m. The laser pulse width may be about 40 ps. The bias pulse provided may suitably be 30 $\mu$s.

The line is charged in synchronism with the activation of the laser (i.e., the firing of the pump lamps 12), by a pulse forming network 40 to which a trigger pulse is applied when the laser pulse is desired. A resistor 42 couples a portion of the voltage from the pulse forming network and applies a pulse, in synchronism with the pulse which fires the lamps 12, to a variable time delay circuit 44. This circuit triggers a high voltage generator 46 as by triggering a thyraton or SCR switch in that generator. The generator 46 produces the high voltage bias pulse, for example 8 kV magnitude, 30 $\mu$s at FWHM (full width half maximum). The duration of width of the bias pulse may be adjusted from 10 $\mu$s to 10 ms. This pulse passes through a current limiting resistor 48 to the line 28. The resistor 48 also decouples the pulse generator 46 from the line 28.

Figure 2:
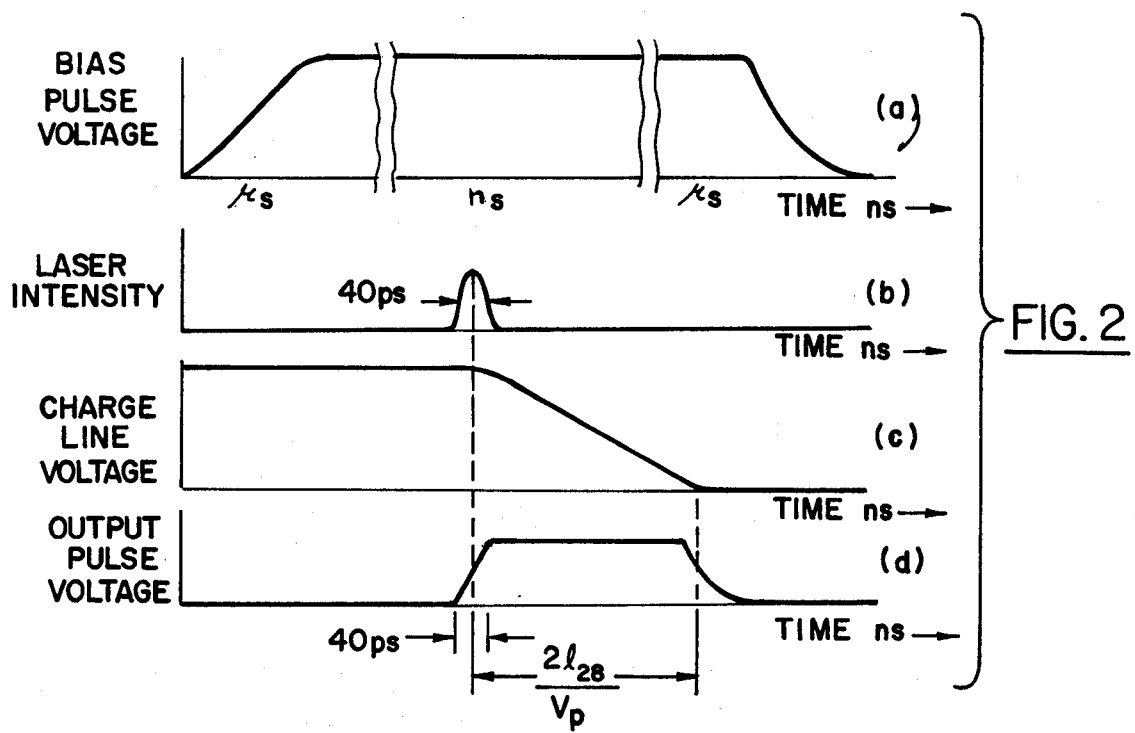
FIG. 2 is a series of waveforms illustrating a typical voltage pulse which is switched by a laser pulse, the laser pulse and the output pulses produced by the apparatus are shown in FIG. 2.

The line 28 then charges and applies the bias pulse across the body 18. This pulse is exemplified by waveform (a) of FIG. 2. The waveform is split since the time scales are different ($\mu$s and ns) in different parts of the waveform. When the optical pulse (exemplified by waveform (b)) occurs, the resistance of the body 18 decreases by 5 to 6 orders of magnitude and the line transmission increases from 0 to 90%-95%. The waveform which occurs as the line discharge is shown in FIG. 2 by waveform (c). The discharge is initiated during the 40 picoseconds duration of the laser pulse and depends upon the electrical propagation time (dictated by the length $l_{28}$) of the line 28. By changing the length of the line 28 the width of the output pulse may be varied. The output pulse (since the switch has a wide bandwidth geometry) of 40 picosecond rise time appears at the load 28. This pulse is shown in waveform (d) of FIG. 2. The magnitude of this pulse is half that of the pulse applied to the line (e.g., 4 kV). The output pulse is precisely synchronized with the laser pulse, with picosecond accuracy, as shown in FIG. 2.

The relative location in time of the high voltage bias pulse which is applied to the body 18 and the laser pulse may be adjusted by means of the variable time delay circuit 44 and by adjusting the optical path 16. Lightpipes or fiber optics may be used to define the path and determine the length of the time delay. Inasmuch as the bias pulse which is applied to the body 18 is long, the laser pulse may easily be synchronized with that pulse.

Figure 3:
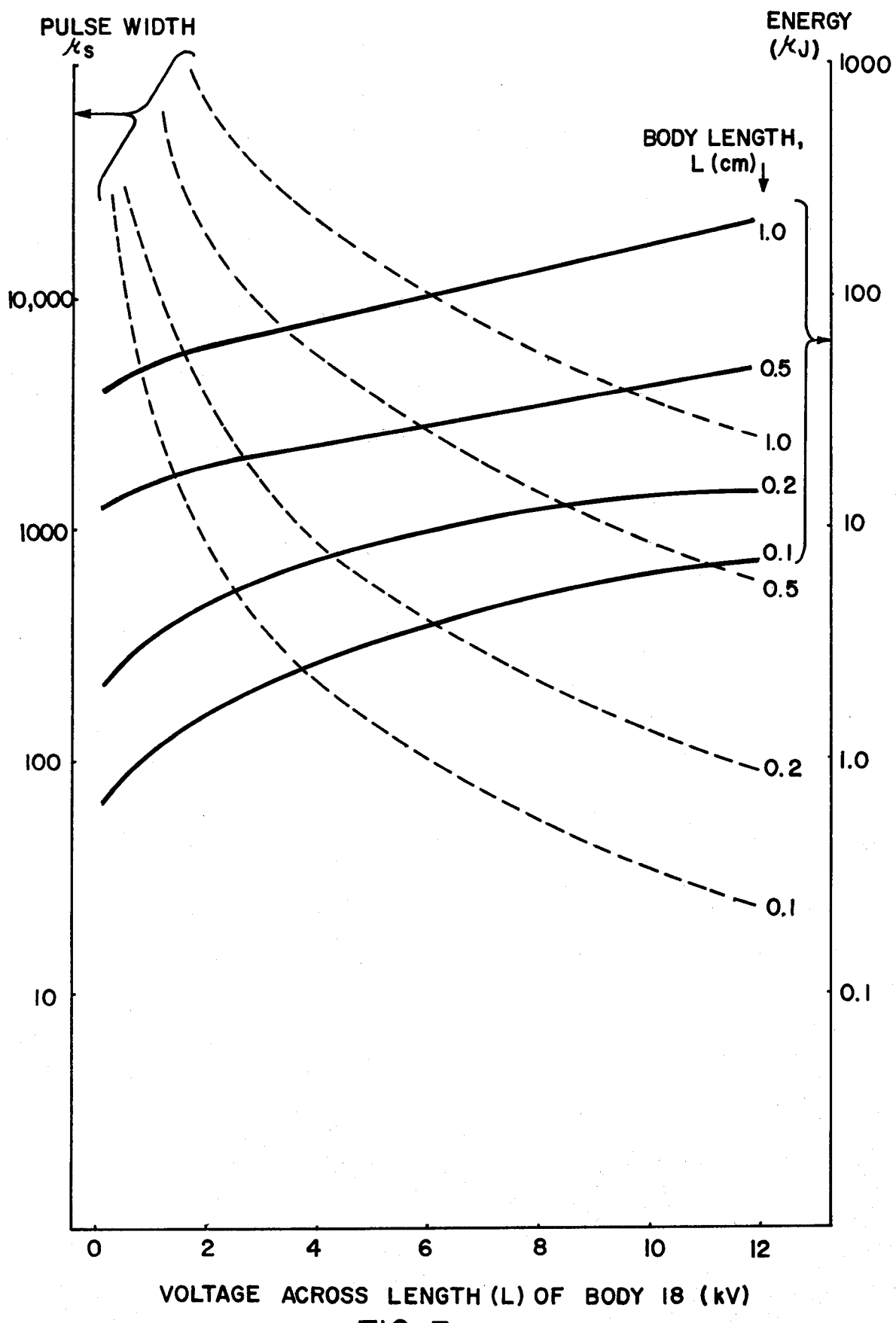
FIG. 3 is a series of curves plotted in accordance with Equations (1), (2) and (3) above which may be used to select the length of the semiconductor body used in the switching apparatus so as to enable switching of high bias voltage pulses of various voltage magnitudes and pulse widths with laser pulses of different energy level.

For such longer pulses which can be easily synchronized with the laser pulses, the voltage hold-off characteristics of the body of semiconductor material are limited by the thermal instability of the material. It has been found that the voltage hold-off time is governed by Equations (1) and (2) which were given above. These equations express the duration or width of the bias pulse which is to be switched in terms of the temperature rise. In order to assure that thermal avalanche will not take place, the length of the body is selected such that the resistance at the initial temperature of the body (i.e., the temperature before the voltage pulses are applied to the body 18) is sufficiently large. Where the initial temperature is room temperature, $T_o = 293°$ K., and the initial resistivity $p_o$ is $3 \times 10^4$ ohm -cm., curves obtained by plotting Equations (1) and (2) are shown in FIG. 3 by the dashed line. The curves shown by the solid line are obtained by plotting Equation (3). These curves shown the laser energy needed to reduce the resistance across the length L of the body to about 5 ohms, for 90% switching in a 50 ohm line.

FIG. 3 may be used to design or select the appropriate size for the body 18 of semiconductor material. For example, for a voltage across the length of the body of 8 kV, a gap length L of 0.2 cm as shown on the second from the bottom-most of the dashed line curves permits the use of a bias voltage pulse width of up to 250 μs. Using the second from the bottom-most solid line curve, also for a body length of 0.2 cm, it will be observed that 15 μJ of laser pulse energy is needed to reduce the resistance in the line presented by the body 18 to 5 ohms and thereby discharge the line to produce the 4 kV output pulse across the load 38.

From the foregoing description it will be apparent that there has been provided improved apparatus for switching high voltage pulses with picosecond precision. Variations and modifications of the hereindescribed embodiment, within the scope of the invention, will undoubtedly suggest themselves to those skilled in the art. For example, the semiconductor material may be other than silicon, for example, GaAs which is doped with chromium or any other nearly intrinsic semiconductor. Accordingly, the foregoing description should be taken as illustrative and not in any limiting sense.

I claim:

1. Apparatus for switching high voltage pulses having magnitudes of the order of 10 kV and durations up to about 10 ms in a period of time of the order of picoseconds, which comprises a body of semiconductor material the resistivity of which both decreases several orders of magnitude when illuminated by optical energy of a certain wavelength and also decreases with increasing temperature, means for supporting said body between a pair of electrodes in a path traversed by a beam of said optical energy, the length of said body between said electrodes being L, said length L being such that for a voltage magnitude $V_o$ of said pulses, the change in temperature T, of said body from an initial temperature $T_o$, the resistivity, p, of said body changes, in the absence of said optical energy illumination, no more than 50% from the resistivity, $p_o$, thereof at the initial temperature where $$\frac{dT}{dt} = \frac{V_o^2}{dcL^2 p}, \text{ and}$$

$$p = p_o \left(\frac{T}{T_o}\right) \exp \frac{-E_g}{2k} \left(\frac{1}{T} - \frac{1}{T_o}\right),$$

where T is the instantaneous temperature of said body in degrees Kelvin, $T_o$ is the initial temperature in degrees Kelvin, p is the resistivity in ohms per centimeter, $p_o$ is the resistivity in ohms per centimeter at temperature $T_o$, c is the specific heat of said semiconductor material, L is said length in centimeters, k is the Boltzmann constant, $E_g$ is the band gap energy of said semiconductor material in Joules, and d is the density of said semiconductor material in grams per cubic centimeter.

2. Apparatus as set forth in claim 1 further comprising a transmission line, said electrodes and said body being included in said line, means for charging said line at an input end thereof to provide said high voltage pulses at said body therein, and load means connected to the output end of said line.

3. Apparatus as set forth in claim 2 wherein said line has a characteristic impedance, $Z_o$, equal to the impedance, $Z_L$, of said load means.

4. Apparatus as set forth in claim 2 wherein said charging means comprises a high voltage pulse generator, a current limiting resistor, said generator being connected to the input end of said line through said resistor.

5. Apparatus as set forth in claim 2 further comprising means for producing said optical energy beam with an absorbed energy $E_a$ in Joules where $$E_a = \frac{5h\nu V_o L}{Z_o e V_s}$$

where h is Planck's constant, $\nu$ is the optical frequency of said optical energy beam in $\sec^{-1}$, e is the charge of the electron, $V_s$ is the carrier saturation velocity of said semiconductor material, and $Z_o$ is the impedance of said line.

6. Apparatus as set forth in claim 1 wherein said beam producing means a laser, triggerable pulse generating means for pumping said laser to produce said illumination in pulses of the order of 10 ps in duration, and means synchronized with said triggerable pulse generator for applying high voltage pulses to said body in synchronism with said beam pulses.

7. Apparatus as set forth in claim 6 wherein said laser is a mode locked optically pumped laser having pump lamp means, said pulse forming means comprises a pulse forming network connected to said lamp means for providing a pulse for firing said lamp means, a transmission line coupled to said body, and said synchronized means including means for charging said line to produce each of said high voltage pulses commencing a predetermined time less than said time $T - T_o$ before said optical pulse reaches said body.

8. Apparatus as set forth in claim 1 wherein said semiconductor material is nearly intrinsic silicon.

9. Apparatus as set forth in claim 1 wherein said electrodes are conductive rods, a conductive cylinder, insulating cylindrical means for supporting said rods coaxially within said cylinder with a gap between opposed ends of said rods, said body being disposed in said gap between the said opposed ends, said cylinder having a lateral opening aligned with said body for the passage of said laser illumination.

10. The apparatus as set forth in claim 1 wherein said initial temperature is room temperature, such as 293° K.

11. The apparatus as set forth in claim 1 wherein said semiconductor material consists of nearly intrinsic silicon and said certain wavelength is equal to or less than 1.06 μm.

* * * * *